United States Patent
Leong et al.

(10) Patent No.: US 12,248,335 B2
(45) Date of Patent: Mar. 11, 2025

(54) PHASE DETECTION CIRCUITRY FOR HIGH-FREQUENCY PHASE ERROR DETECTION

(71) Applicant: Synopsys, Inc., Mountain View, CA (US)

(72) Inventors: Choon H. Leong, Portland, OR (US); Cuneyt Demirdag, Nashua, NH (US)

(73) Assignee: Synopsys, Inc., Sunnyvale, CA (US)

( * ) Notice: Subject to any disclaimer, the term of this patent is extended or adjusted under 35 U.S.C. 154(b) by 43 days.

(21) Appl. No.: 18/119,761

(22) Filed: Mar. 9, 2023

(65) Prior Publication Data
US 2024/0302855 A1    Sep. 12, 2024

(51) Int. Cl.
*G06F 1/08*    (2006.01)
*G01R 25/00*   (2006.01)
*G06F 1/10*    (2006.01)
*H03D 7/14*    (2006.01)

(52) U.S. Cl.
CPC ............. *G06F 1/08* (2013.01); *G01R 25/00* (2013.01); *G06F 1/10* (2013.01); *H03D 7/1441* (2013.01)

(58) Field of Classification Search
CPC .. G06F 1/08; G06F 1/10; G01R 25/00; H03D 7/1441; H03D 7/145
See application file for complete search history.

(56) References Cited

U.S. PATENT DOCUMENTS

| | | | | |
|---|---|---|---|---|
| 8,036,614 | B2* | 10/2011 | Blum | H03L 7/0805 455/208 |
| 8,901,981 | B2* | 12/2014 | Park | H03K 5/131 327/276 |
| 9,461,655 | B2* | 10/2016 | Boecker | H04L 7/0029 |

OTHER PUBLICATIONS

Wang, et al. "11.4 A High-Accuracy Multi-Phase Injection-Locked 8-Phase 7GHz Clock Generator in 65nm with 7b Phase Interpolators for High-Speed Data Links" IEEE Mar. 3, 2021.
Chen et al., "A 4-to-16GHz inverter-based injection-locked quadrature clock generator with phase interpolators for multi-standard I/Os in 7nm FinFET" IEEE Mar. 12, 2018.

\* cited by examiner

*Primary Examiner* — Menatoallah Youssef
*Assistant Examiner* — Colleen J O'Toole
(74) *Attorney, Agent, or Firm* — Patterson + Sheridan, LLP

(57) ABSTRACT

Phase detector circuitry includes first mixer circuitry configured to receive a first clock signal and a second clock signal. The first mixer circuitry includes a first plurality of transistors. The first plurality of transistors includes first transistors, second transistors, and an output transistor. The first transistors receive the first clock signal, and the second transistors receive the second clock signal. The first output transistor outputs a first output signal. The first output signal corresponds to a first phase difference between the first clock signal and the second clock signal.

19 Claims, 6 Drawing Sheets

PHASE DETECTION CIRCUITRY FOR HIGH-FREQUENCY PHASE ERROR DETECTION

TECHNICAL FIELD

The present disclosure generally relates to a circuit device. In particular, the present disclosure relates to mitigating errors in multi-phase clock signals using a transistor based phase error detector circuitry.

BACKGROUND

Multi-phase systems use two or more clock signal phases (e.g., multi-phase clock signal) to transmit and/or receive signals. The multi-phase clock signals are generated from a common reference clock signal. In one instance, a delay line circuitry receives a reference clock signal and generates the multi-phase clock signals. However, the conventional techniques used to generate the multi-phase clock signals are error prone. The errors may result in phase error between two or more of the multi-phase clock signals. In this instance, a phase error detection circuitry is used to detect the phase error and control the delay line circuitry to mitigate the phase error. The phase error detection circuitry includes phase detection circuitry that includes mixers that detect phase differences between pairs of the multi-phase clock signals.

SUMMARY

In one example, phase detector circuitry includes first mixer circuitry configured to receive a first clock signal and a second clock signal. The first mixer circuitry includes a first plurality of transistors. The first plurality of transistors includes first transistors, second transistors, and an output transistor. The first transistors receive the first clock signal, and the second transistors receive the second clock signal. The first output transistor outputs a first output signal. The first output signal corresponds to a first phase difference between the first clock signal and the second clock signal.

In one example, a multi-phase clock generation system includes clock generation circuitry and phase detection circuitry. The clock generation circuitry receives a reference clock signal and generates a plurality of clock signals. The phase detection circuitry receives the plurality of clock signals, and includes first mixer circuitries. The first mixer circuitry includes a plurality of transistors and a first output transistor. The first plurality of transistors receives a first clock signal of the plurality of clock signals and a second clock signal of the plurality of clock signals, and generates a first output signal based on a phase difference between the first clock signal and the second clock signal. The first output transistor outputs the first output signal.

In one example, a non-transitory computer readable medium includes a circuit design stored therein. The circuit design includes first mixer circuitry that receives a first clock signal and a second clock signal. The first mixer circuitry includes a first plurality of transistors that include first transistors, second transistors, and a first output transistor. The first transistors receive the first clock signal, and the second transistors receive the second clock signal. The first output transistor output a first output signal. The first output signal corresponds to a first phase difference between the first clock signal and the second clock signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
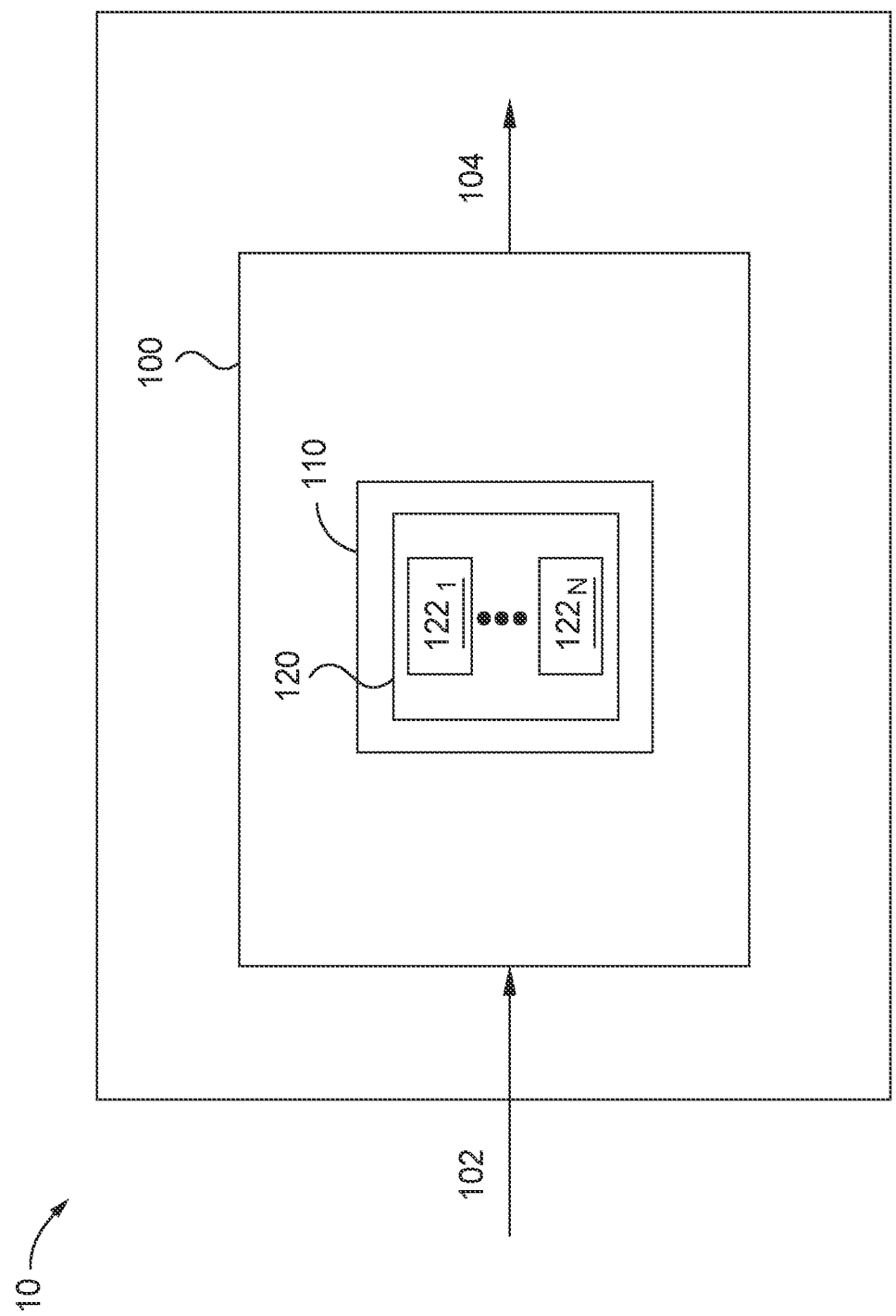
FIG. 1 illustrates a block diagram of an electronic device that includes multi-phase clock generator system in accordance with some embodiments of the present disclosure.

Aspects of the present disclosure relate to phase detection circuitry for high-frequency phase error detection.

Multi-phase systems use two or more clock signal phases (e.g., multi-phase clock signals) to transmit and/or receive signals. Example multi-phase systems include transceiver devices (e.g., serializer/deserializer (SerDes) transceivers, among others), radio frequency (RF) systems, and systems that process data using multi-phase clock signals. Multi-phase clock signals may be used in data conversion systems, such as time division multiplexed or time-interleaved data conversion in serial link data conversion systems. In one or more examples, multi-phase clock signals may be used to demodulate radio frequency (RF) signals using in-phase and quadrature (IQ) mixing processes. The multi-phase system may be a wireline or wireless system. In one or more examples, the multi-phase system may be used in electronically scanned array antennas, analog-to-digital converters, quarter rate transmitters and/or half rate transmitters.

In a multi-phase system, the multi-phase clock signals are generated by clock generation circuitry from a reference clock signal. In one or more examples, one or more of the multi-phase clock signals have the same frequency. Further, in one or more examples, ideally, the multi-phase clock signals are equally spaced in time. In one example, the frequency of the multi-phase clock signals may be the same as the frequency of the reference clock signal. The clock generation circuitry may be delay line circuitry (e.g., voltage controlled delay circuitry (VCDL) circuitry, among others), injection-locked oscillator (ILO) circuitry, delay-locked loop (DLL) circuitry, or ring oscillator circuitry, among others. The clock generation circuitry receives the reference clock signal and generates multi-phase clock signals from the reference clock signal.

In one example, the multi-phase system is a high-frequency multi-phase clock generator. The high-frequency multi-phase clock generator receives a reference clock signal, which is used to generate the multi-phase clock signals. High frequency multi-phase clock generator may include multi-phase oscillator circuitry operating in a phase-locked loop, a multi-phase oscillator operating in an injection-locked configuration, or a multi-phase delay line in a delay-locked loop configuration. In one example, high frequency refers to at least about 10 GHz. In other examples, high frequency may be less than or greater than about 10 GHz.

Errors (e.g., phase errors) may be present in the multi-phase clock signals. The errors correspond to the phase of one or more of the multi-phase clock signals deviating from the expected (or intended) phase, and may introduce errors within the downstream signal processing.

To mitigate phase error between the multi-phase clock signals, phase error detection circuitry is used to detect (or measure) phase error between pairs of the multi-phase clock signals, and generate a one or more signals based on the detected phase error. The one or more signals are provided to the clock generation circuitry, which generates adjusted multi-phase clock signals based on the control signal. The control signal is used by the clock generation circuitry to mitigate phase error between the multi-phase clock signals, generating adjusted multi-phase clock signals. Some phase error detection circuitry may include phase detection circuitry that includes mixer circuitries, which detect phase differences between pairs of the multi-phase clock signals. The mixer circuitry includes a combination of passive and active devices (e.g., resistors and transistors) that function to detect phase differences between pairs of the multi-phase clock signals. However, the use of passive devices increases the circuit area of the mixer circuitries, increasing the semiconductor manufacturing costs of the corresponding multi-phase system.

The multi-phase system described herein uses a phase detection circuitry that includes mixer circuitries that are formed from transistors and omits resistors. For example, the mixer circuitries as described herein are formed from n-type metal-oxide semiconductor (NMOS) transistors and/or p-type MOS (PMOS) transistors that used to detect phase differences between pairs of the multi-phase clock. Further, the mixer circuitries described herein include output transistors, having a power state controlled by respective bias voltages.

The technical advantages of the present disclosure include, but are not limited to mixer circuitries that are formed from active devices (e.g., transistors), omitting passive devices (e.g., resistors), reducing the circuit area of the corresponding multi-phase system. Reducing the circuit area reduces the semiconductor manufacturing cost of the corresponding multi-phase system. Additionally, the use of transistors, allows for easier integration within semiconductor devices that include other elements of a similar semiconductor technology (e.g., metal oxide semiconductors, among others) providing easier layout integration, and low loading and low routing complexity imposed on the multi-phase clock signals. The mixer circuitries as described herein may be referred to as being compact mixer circuitries due to the small circuit area, and as the mixer circuitries may be positioned (e.g., abutted) next to the corresponding clock generator circuitry within the circuit design. Further, the mixer circuitries described herein have differential outputs controlled via transistors. The output transistors are biased with corresponding bias voltage signals. Accordingly, the mixer circuitries may be placed in a powered down state using the bias voltage signals, reducing the power consumption of the corresponding multi-phase system. The output transistors provide the ability to independently shut down the mixer circuitries to save power. Further, the mixer circuitries as described herein provide increased robustness over process, voltage, and temperature (PVT) variations, providing a consistent performance over PVT variations as compared to other mixer circuitries that include both active and passive devices. As is described in further detail in the following the mixer circuitries described herein have low and balanced input loading, and low inherent offset that provides more accurate error detection based.

FIG. 1 illustrates a block diagram of an electronic system 10, according to one or more examples. The electronic system 10 may be a system that operates using multiple clock signals. In one example, the electronic system 10 is a fast time-interleaved analog-to-digital converter (ADC) circuitry. In such an example, time-interleaved ADC circuitry utilizes multiple slower running ADC circuitries to implement a faster ADC circuitry. In another example, the electronic system 10 is a wireless communications system that implement beamforming using multi-phase clock signals. In one example, the electronic system 10 is at least a part of a transceiver system, an RF system, and/or a data processing system that processes a data signal at different phases.

Figure 6:
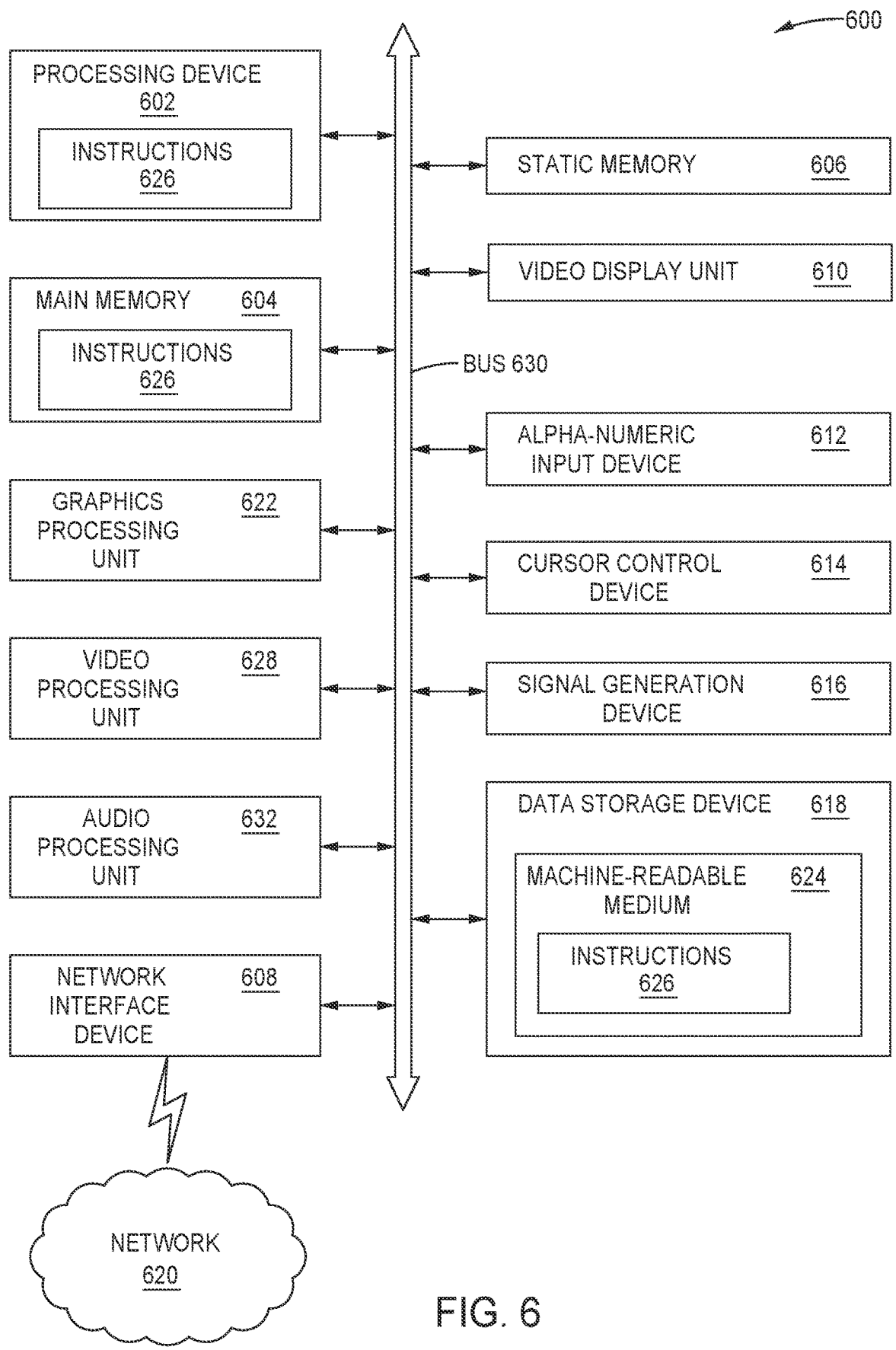
FIG. 6 depicts a diagram of an example computer system in which embodiments of the present disclosure may operate.

In one example, a digital representation of the circuit design of the electronic system 10 is stored within a memory (e.g., the main memory 604 of FIG. 6 and/or the machine-readable medium 624 of FIG. 6).

The electronic system 10 includes multi-phase clock generation circuitry 100. The multi-phase clock generation circuitry 100 receives a clock signal 102, and generates multi-phase clock signals 104 from the clock signal 102. The clock signal 102 is the reference (e.g., a reference clock signal generated internally or externally) used to generate the multi-phase clock signals 104. In one example, the frequency for each of the multi-phase clock signals 104 corresponds to the frequency of the clock signal 102. In such an example, the multi-phase clock signal 104 have the same frequency. The multi-phase clock signals 104 includes two or more clock signals that are separated from each other by M degrees, where M is greater than zero. In one example, M is 45 degrees. In other examples, M is greater than or less than 45 degrees.

The multi-phase clock signals 104 may be received by downstream processing elements within and/or external to the electronic system 10, and used to process data, or perform other processing tasks. For example, the multi-phase clock signals 104 may be provided to data processing circuit elements that process received data signals with the multi-phase clock signals.

In one example, the multi-phase clock generation circuitry 100 includes phase measurement circuitry 110 that is configured to measure (e.g., determine or detect) phase error between pairs of the multi-phase clock signals 104. The phase measurement circuitry 110 generates one or more signals that are indicative of phase error within the multi-phase clock signals 104. The one or more signals are used by the multi-phase clock generation circuitry 100 to mitigate phase errors between the multi-phase clock signals 104. For example, one or more properties (e.g., a variable delay or an operating frequency, among others) is adjusted based on the one or more signals to mitigate phase errors within the multi-phase clock signals 104.

In one example, a digital representation of the circuit design of the multi-phase clock generation circuitry 100 is stored within a memory (e.g., the main memory 604 of FIG. 6 and/or the machine-readable medium 624 of FIG. 6).

The phase measurement circuitry 110 includes phase detection circuitry 120. The phase detection circuitry 120 receives the multi-phase clock signals 104 and generates one or more phase error signals. The phase detection circuitry may be a quadrature phase detection circuitry that detects the phase differences between the multi-phase clock signals 104 that are in quadrature with each other. In other examples, the phase detection circuitry detects the phase differences between the multi-phase clock signals 104 that are not in quadrature with each other (e.g., differ by more or less than 90 degrees).

In one example, a digital representation of the circuit design of the phase measurement circuitry 110 is stored within a memory (e.g., the main memory 604 of FIG. 6 and/or the machine-readable medium 624 of FIG. 6).

The phase detection circuitry 120 includes mixer circuitries 122. The mixer circuitries 122 detect a phase difference between pairs of the multi-phase clock signals 104. The phase difference may be referred to as a phase error. The mixer circuitries 122 includes mixer circuitries $122_1$-$122_N$, where N is two or more. In one example, N is at least four. Each of the mixer circuitries 122 receives a different two of the multi-phase clock signals 104, determines whether or not a phase error is present between the multi-phase clock signals 104, and outputs a signal indicative of the phase error.

In one example, a digital representation of the circuit design of the phase detection circuitry 120 is stored within a memory (e.g., the main memory 604 of FIG. 6 and/or the machine-readable medium 624 of FIG. 6). In one or more example, a digital representation of the circuit design of one or more of the mixer circuitries 122 is stored within a memory (e.g., the main memory 604 of FIG. 6 and/or the machine-readable medium 624 of FIG. 6).

Figure 2:
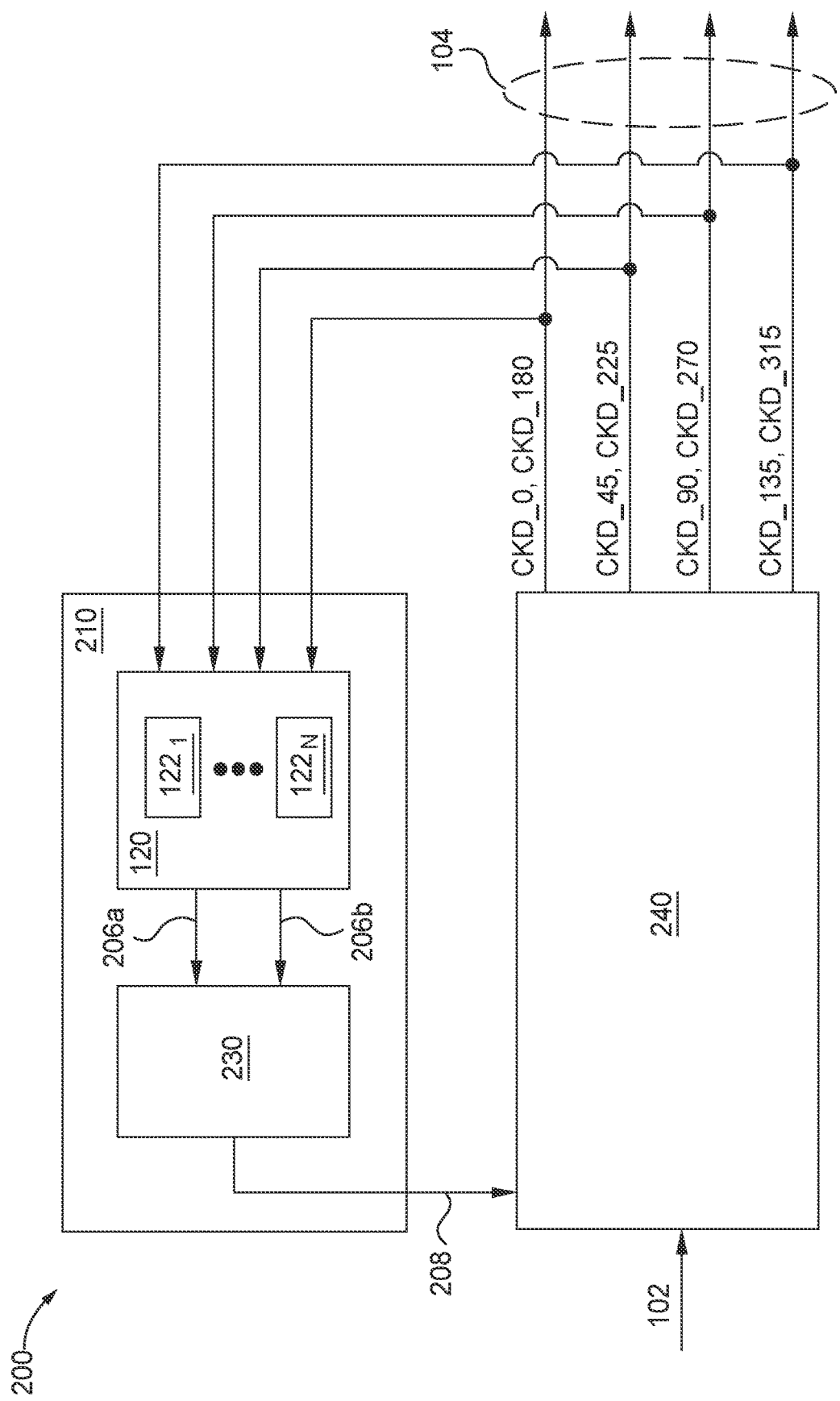
FIG. 2 illustrates a block diagram of a multi-phase clock generator system in accordance with some embodiments of the present disclosure.

FIG. 2 illustrates one example of a multi-phase clock generation system 200, according to one or more examples. The multi-phase clock generation system 200 receives a reference clock signal 102, and generates the multi-phase clock signals 104. The multi-phase clock signals 104 are output from the multi-phase clock generation system 200. The multi-phase clock generation system 200 of FIG. 2 converts a phase error between pairs of the multi-phase clock signals 104 to a differential voltage to realign corresponding clock generation circuitry (e.g., clock generation circuitry 240) to mitigate the phase error.

In one example, a digital representation of the circuit design of the multi-phase clock generation system 200 is stored within a memory (e.g., the main memory 604 of FIG. 6 and/or the machine-readable medium 624 of FIG. 6).

In one example, the multi-phase clock signals 104 include multi-phase clock signals CKD_0, CKD_45, CKD_90, CKD_135, CKD_180, CKD_225, CKD_270, and CKD_315. Each of the multi-phase clock signals CKD_0, CKD_45, CKD_90, CKD_135, CKD_180, CKD_225, CKD_270, and CKD_315 has a different phase. In one example, the multi-phase clock signals 104 are separated in phase by 45 degrees. In other example, the multi-phase clock signals 104 are separated by more than or less than 45 degrees. The phase difference is consistent between pairs of the multi-phase clock signals 104.

The multi-phase clock generation system 200 includes clock generation circuitry 240 and phase measurement circuitry 210. The input of the phase measurement circuitry 210 is connected to the output of the clock generation circuitry 240. The clock generation circuitry 240 may be VCDL circuitry, ILO circuitry, DLL circuitry, or ring oscillator circuitry, among others. In one example, the clock generation circuitry 240 includes one or more buffers that output the multi-phase clock signals 104.

The clock generation circuitry 240 receives the reference clock signal 102. In one example, the clock generation circuitry 240 generates each of the different multi-phase clock signals 104 based on the frequency of this reference clock signal 102.

The phase measurement circuitry 210 receives the multi-phase clock signals 104, detects a phase error within a group or subset of the multi-phase clock signals 104, and generates one or more signals 208 indicative of an error among the multi-phase clock signals 104. The one or more signals 208 provides an indication to adjust the clock generation circuitry 240 to mitigate phase error between two or more of the multi-phase clock signals 104.

The phase measurement circuitry 210 includes phase detection circuitry 120, and amplifier circuitry 230. The phase detection circuitry 120 is configured similar to the phase detection circuitry 120 of FIG. 1. The phase detection circuitry 120 receives the multi-phase clock signals 104 and generates the phase error signals 206a and 206b. In one example, the phase detection circuitry may be a quadrature phase detection circuitry that detects the phase differences between pairs of the multi-phase clock signals 104 that are in quadrature with each other. In other examples, the phase detection circuitry detects the phase differences between two of the multi-phase clock signals 104 that are not in quadrature with each other. The phase error signals 206a and 206b may be part of a differential phase error signal 206 in voltage form. The amplifier circuitry 230 amplifies the phase error signals 206a and 206b, and generates the one or more signals 208 from the phase error signals 206a and 206b.

The phase detection circuitry 120 includes mixer circuitries 122. The mixer circuitries 122 detect a phase difference between pairs of the multi-phase clock signals 104. The mixer circuitries 122 includes mixer circuitries $122_1$-$122_N$, where N is two or more. In one example, N is at least four. Each of the mixer circuitries 122 receives a different pair of the multi-phase clock signals 104. Each mixer circuitry 122 outputs a signal indicative of a phase error between a respective two of the multi-phase clock signals 104. The output signals of each of the mixer circuitries 122 is combined to form the phase error signals 206. In an example where the mixer circuitries 122 detect phase errors between multi-phase clock signals that are in quadrature with each other, the mixer circuitry $122_1$ receives the multi-phase clock signals CKD_0 and CKD_90, the mixer circuitry $122_2$ receives the multi-phase clock signals CKD_180 and CKD_270, the mixer circuitry $122_3$ receives the multi-phase clock signals CKD_180 and CKD_90, and the mixer circuitry $122_4$ receives the multi-phase clock signals CKD_270 and CKD_0. In other examples, the mixer circuitries $122_1$-$122_4$ receive other combinations of the multi-phase clock signals 104.

In one example, the clock generation circuitry 240 receives the one or more signals 208, and generates adjusted multi-phase clock signals. The adjusted multi-phase clock signals are received by the phase detection circuitry 120 to determine if a phase error is present within the adjusted multi-phase clock signals as described above. In one or more examples, using phase detection circuitry to receive and detect phase error between pairs of the adjusted multi-phase clock signals is continuously performed to mitigate the phase error between pairs of the adjusted multi-phase clock signals.

Figure 3:
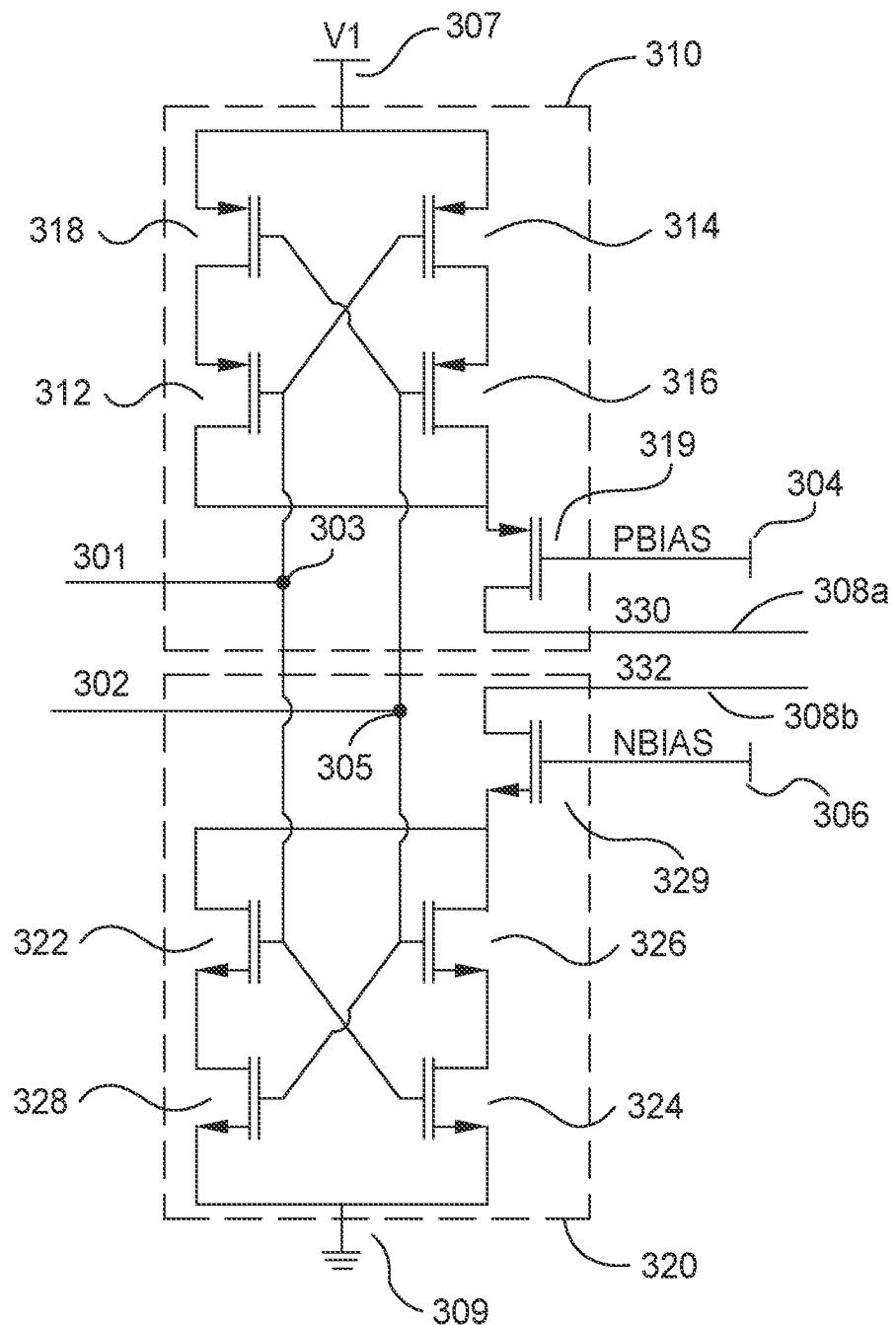
FIG. 3 illustrates a circuit diagram of mixer circuitry of phase detector circuitry in accordance with some embodiments of the present disclosure.

FIG. 3 illustrates a schematic circuit diagram of the mixer circuitry 122, according to one or more examples. Each of the mixer circuitries $122_1$-$122_N$ is configured as described with regard to the mixer circuitry 122 of FIG. 3. In one example, a digital representation of the circuit design of the mixer circuitry 122 as illustrated in FIG. 3 is stored within a memory (e.g., the main memory 604 of FIG. 6 and/or the machine-readable medium 624 of FIG. 6).

The mixer circuitry 122 includes transistors 310 and transistors 320. The transistors 310 and 320 receive multi-phase clock signals 301 and 302, and determine whether or not a phase error is present between the multi-phase clock signals 301 and 302. The multi-phase clock signals 301 and 302 are two (e.g., a pair) of the multi-phase clock signals 104. For example, the multi-phase clock signals 301 and 302 include two of the multi-phase clock signals 104 that are in quadrature with each other. In another example, the multi-phase clock signals 301 and 302 include two of the multi-phase clock signals 104 that are not in quadrature with each other. In such an example, the multi-phase clock signals 301 and 302 are separated by more or less than ninety degrees. As pairs of transistors in each of the transistors 310 and 120 receive the multi-phase clock signals 301 and 302, respectively, the transistors 310 and 320, and the mixer circuitry 122 has balanced input loading.

In one example, the size of the transistors 310 and 320 corresponds to the loading of the transistors, mismatch between the transistors, and/or phase-current-conversion gain and power of the transistors.

The transistors 310 includes transistors 312, 314, 316, 318, and 319. The transistors 312, 314, 316, 318, and 319 are PMOS transistors.

The transistor 312 has a gate node coupled to the input node 303 and that receives the multi-phase clock signal 301. Further, the transistor 312 has a source node coupled to a drain node of the transistor 318, and a drain node coupled to the source node of the transistor 319. The transistor 314 has a gate node coupled to the input node 303 and that receives the multi-phase clock signal 301. Further, the transistor 314 has a source node coupled to the voltage node 307, and a drain node coupled to the source node of the transistor 316. The voltage node 307 receives a voltage V1. The voltage V1 is received from a voltage source.

The transistor 316 has a gate node coupled to the input node 305 and that receives the multi-phase clock signal 302. Further, the transistor 316 has a source node coupled to the drain node of the transistor 314, and a drain node coupled to the source node of the transistor 319. The transistor 318 has a gate node coupled to the input node 305 and that receives the multi-phase clock signal 302. Further, the transistor 316 has a source node coupled to the drain node of the transistor 314, and a drain node coupled to the source node of the transistor 319. The transistor 319 has a gate node coupled to the voltage node 304, a source node coupled to the drain nodes of the transistors 312 and 316, and a drain node coupled to the output node 208*a*.

The transistors 312, 314, 316, and 318 function as part of a phase-to-current converter to determine whether or not a phase difference (e.g., phase error) is present between the multi-phase clock signals 301 and 302. In one example, the transistors 312, 314, 316, and 318 generate a current signal based on a phase difference between the multi-phase clock signals 301 and 302.

The voltage node 304 receives a bias voltage signal (e.g., a PMOS voltage bias (PBIAS) signal). A PBIAS voltage bias signal is used in examples where the transistor 319 is a PMOS transistor. In other examples, other bias signals may be used. The PBIAS signal controls whether or not the transistor 319 is in powered on state, and outputs an output signal 330 via the output node 308*a*. In one example, based on the PBIAS signal having a voltage magnitude greater than the turn-on voltage of the transistor 319, the transistor 319 outputs output signal 330 via output node 308*a*. Based on the PBIAS signal having a voltage magnitude less than the turn-on voltage of the transistor 319, the transistor 319 is in a powered off state. In one example, placing the transistor 319 in a powered off state, places the mixer circuitry 122 in a powered off state, reducing the power consumed by the mixer circuitry 122.

The transistors 320 includes transistors 322, 324, 326, 328, and 329. The transistors 322, 324, 326, 328, and 329 are NMOS transistors.

The transistor 322 has a gate node coupled to the input node 303 and that receives the multi-phase clock signal 301. Further, the transistor 322 has a source node coupled to a drain node of the transistor 328, and a drain node coupled to the source node of the transistor 329. The transistor 324 has a gate node coupled to the input node 303 and that receives the multi-phase clock signal 301. Further, the transistor 324 has a source node coupled to the voltage node 309, and a drain node coupled to the source node of the transistor 326. The voltage node 309 receives a ground voltage signal. In one example, the voltage V1 has a voltage value that is greater than that of the ground voltage signal.

The transistor 326 has a gate node coupled to the input node 305 and that receives the multi-phase clock signal 302. Further, the transistor 326 has a source node coupled to the drain node of the transistor 324, and a drain node coupled to the source node of the transistor 329. The transistor 328 has a gate node coupled to the input node 305 and that receives the multi-phase clock signal 302. Further, the transistor 326 has a source node coupled to the drain node of the transistor 324, and a drain node coupled to the source node of the transistor 329. The transistor 329 has a gate node coupled to the voltage node 306, a source node coupled to the drain nodes of the transistors 322 and 326, and a drain node coupled to the output node 308*b*.

The transistors 322, 324, 326, and 328 function as part of a phase-to-current converter to determine whether or not a phase difference (e.g., phase error) is present between the multi-phase clock signals 301 and 302. In one example, the transistors 322, 324, 326, and 328 generate a current signal based on a phase difference between the multi-phase clock signals 301 and 302.

The voltage node 306 receives a NMOS voltage bias (NBIAS) signal. The NBIAS signal controls whether or not the transistor 329 is in powered on state, and outputs an output signal 332 via the output node 308*b*. A NBIAS voltage bias signal is used in examples where the transistor 319 is a NMOS transistor. In other examples, other bias signals may be used. In one example, based on the NBIAS signal having a voltage magnitude greater than the turn-on voltage of the transistor 329, the transistor 329 outputs output signal 332 via output node 308*b*. Based on the NBIAS signal having a voltage magnitude less than the turn-on voltage of the transistor 329, the transistor 329 is in a powered off state. In one example, placing the transistor 329 in a powered off state, places the transistors 320 in a powered off state, reducing the power consumed by the mixer circuitry 122.

In one example, the output signals 330 and 332 form a corresponding differential signal. The output signals 330 and 332 are current signals. In one example, the magnitude of the output signal 330 differs from the magnitude of the output signal 332 based on a lack of balance in the overlap between the phase of the multi-phase clock signal 301 and the phase of the multi-phase clock signal 302. The phases of the multi-phase clock signals are balanced when the spacing between the phases of the multi-phase clock signals is equal. In one example, the magnitudes of the output signals 330 and 332 do not differ from each other based on the overlap of the phases of the multi-phase clock signal 301 and the multi-phase clock signal 302 being balanced.

Figure 4:
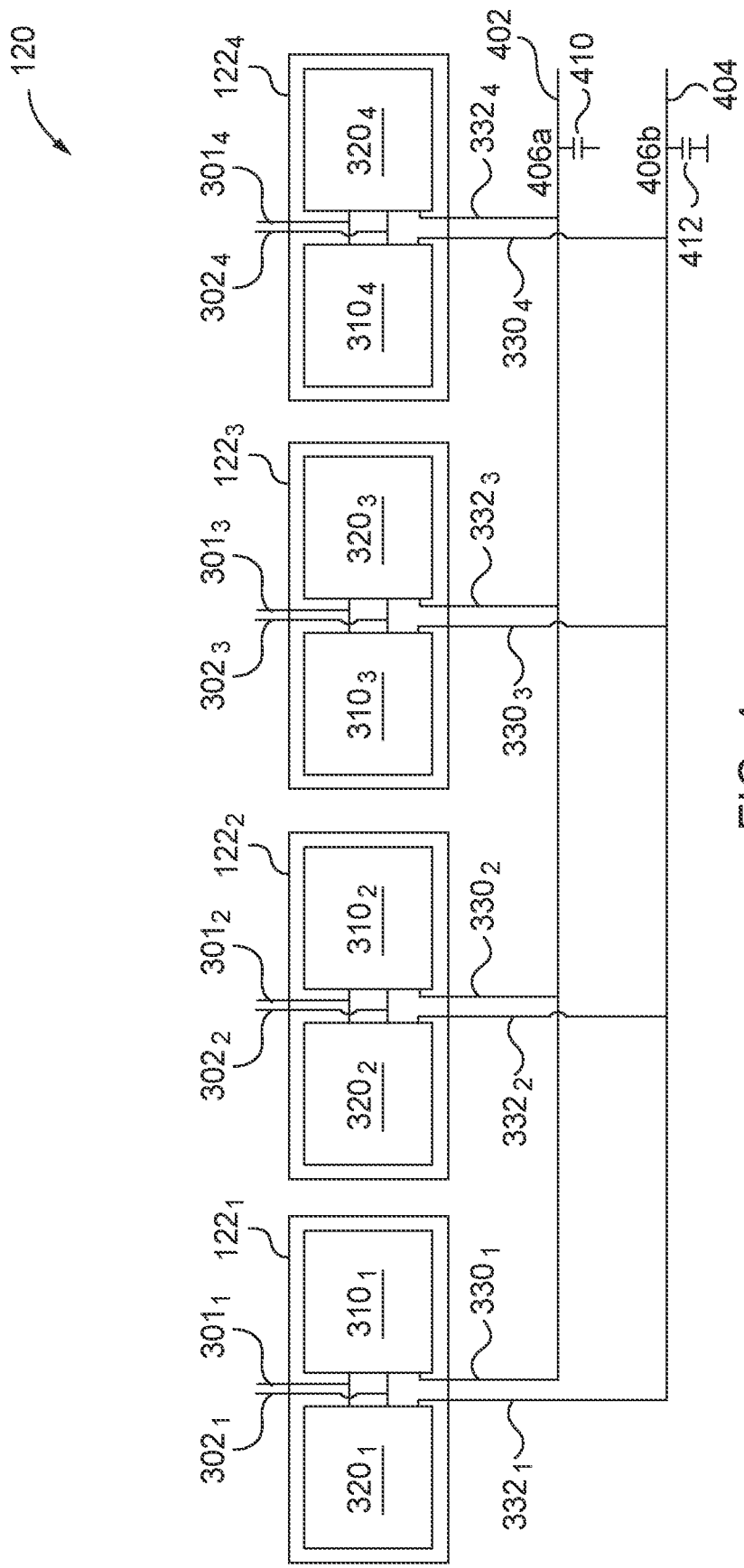
FIG. 4 illustrates a block diagram of an example phase detector circuitry in quadrature phase error detection configuration in accordance with some embodiments of the present disclosure.

FIG. 4 illustrates a block diagram of the phase detection circuitry 120, according to one or more examples. As illustrated in FIG. 4, the phase detection circuitry 120 includes mixer circuitries $122_1$-$122_4$. Further, the phase detection circuitry 120 includes capacitors 410 and 412. The mixer circuitry $122_1$ includes transistors $310_1$ and $320_1$. Further, the mixer circuitry $122_1$ receives the multi-phase clock signals $301_1$ and $302_1$. The transistors $310_1$ outputs the signal $330_1$, and the transistors $320_1$ outputs the signal $332_1$. The signal $330_1$ and the signal $332_1$ correspond to a phase difference (e.g., phase error) between the multi-phase clock signals $301_1$ and $302_1$.

The mixer circuitry $122_2$ includes transistors $310_2$ and $320_2$. Further, the mixer circuitry $122_2$ receives the multi-phase clock signals $301_2$ and $302_2$. The transistors $310_2$ outputs the signal $330_2$, and the transistors $320_2$ outputs the signal $332_2$. The signal $330_2$ and the signal $332_2$ correspond to a phase difference (e.g., phase error) between the multi-phase clock signals $301_2$ and $302_2$.

The mixer circuitry $122_3$ includes transistors $310_3$ and $320_3$. Further, the mixer circuitry $122_3$ receives the multi-phase clock signals $301_3$ and $302_3$. The transistors $310_3$ outputs the signal $330_3$, and the transistors $320_3$ outputs the signal $332_3$. The signal $330_3$ and the signal $332_3$ correspond to a phase difference (e.g., phase error) between the multi-phase clock signals $301_3$ and $302_3$.

The mixer circuitry $122_4$ includes transistors $310_4$ and $320_4$. Further, the mixer circuitry $122_4$ receives the multi-phase clock signals $301_4$ and $302_4$. The transistors $310_4$ outputs the signal $330_4$, and the transistors $320_4$ outputs the signal $332_4$. The signal $330_4$ and the signal $332_4$ correspond to a phase difference (e.g., phase error) between the multi-phase clock signals $301_4$ and $302_4$.

In one example, the multi-phase clock signals $301_1$ and $302_1$ correspond to multi-phase clock signals CKD_0 and CKD_90, the multi-phase clock signals $301_2$ and $302_2$ correspond to multi-phase clock signals CKD_180 and CKD_270, the multi-phase clock signals $301_3$ and $302_3$ correspond to multi-phase clock signals CKD_180 and CKD_90, and the multi-phase clock signals $301_4$ and $302_4$ correspond to multi-phase clock signals CKD_270 and CKD_0. In other examples, the multi-phase clock signals $301_1$, $301_2$, $301_3$, $301_4$, $302_1$, $302_2$, $302_3$, and $302_4$ may be other combinations of the multi-phase clock signals 104. For example, the multi-phase clock signals $301_1$ and $302_1$, $301_2$ and $302_2$, $301_3$ and $302_3$, and/or $301_4$ and $302_4$ may be in quadrature with other, or differ by more than or less than ninety degrees.

The capacitor 410 receives the signals $330_1$, $330_2$, $332_3$, and $332_4$ and generates a phase error signal 406a based on the signals $330_1$, $330_2$, $332_3$, and $332_4$. The signals $330_1$, $330_2$, $332_3$, and $332_4$ are current signals and the phase error signal 406a is a voltage signal. In one example, the capacitor 410 converts the current signals $330_1$, $330_2$, $332_3$, and $332_4$ to a voltage signal, the phase error signal 406a. The phase error signal 406a is output via the node 402. The value of the phase error signal 406a corresponds to the value of the signals $330_1$, $330_2$, $332_3$, and $332_4$.

The capacitor 412 receives the signals $330_3$, $330_4$, $332_1$, and $332_2$, and generates the phase error signal 406b based on the signals $330_3$, $330_4$, $332_1$, and $332_2$. The signals $330_3$, $330_4$, $332_1$, and $332_2$, are current signals and the phase error signal 406b is a voltage signal. In one example, the capacitor 412 converts the current signals $330_3$, $330_4$, $332_1$, and $332_2$ to a voltage signal, the phase error signal 406b. The phase error signal 406b is output via the node 404. The value of the phase error signal 406b corresponds to the value of the signals $330_3$, $330_4$, $332_1$, and $332_2$. In one example, the phase error signals 406a and 406b form a differential signal that represents the average phase error.

In one example, a digital representation of the circuit design of the phase detection circuitry 120 as illustrated in FIG. 4 is stored within a memory (e.g., the main memory 604 of FIG. 6 and/or the machine-readable medium 624 of FIG. 6).

Figure 5:
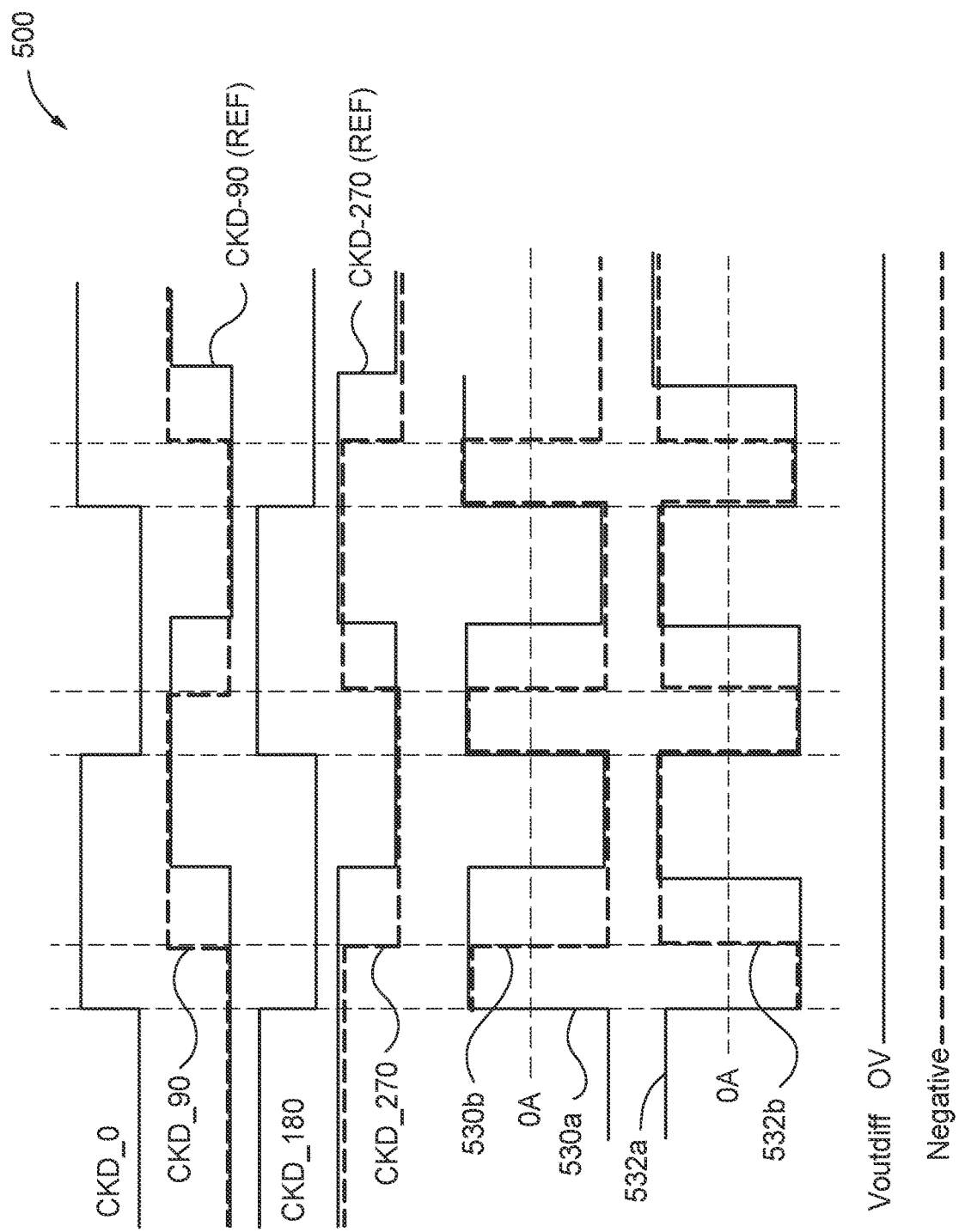
FIG. 5 illustrates a timing diagram of multi-phase clock signals in accordance with some embodiments of the present disclosure.

FIG. 5 illustrates an example timing diagram 500 of the multi-phase clock signals CKD_0, CLKD_90, CKD_180, and CKD_270, corresponding output signals 530a, 530b, 532a, and 532b, and output signal $V_{OUTDIFF}$. The timing diagram 500 further includes a reference multi-phase clock signal CKD_90 (REF) waveform and a reference multi-phase clock signal CKD_270 (REF) waveform. The reference multi-phase clock signal CKD_90 (REF) waveform and the reference multi-phase clock signal CKD_270 (REF) waveform represent ideal signal waveforms (e.g., have ideal phase with no phase error) of the multi-phase clock signals CKD_90 and CKD_270, respectively, and are included as a reference for to illustrate the phase error with the multi-phase clock signals CKD_90 and CKD_270. As illustrated in FIG. 5, the phase of the multi-phase clock signal CKD_90 is less than the phase of the reference multi-phase clock signal CKD_90 (REF). Further, the phase of the multi-phase clock signals CKD_270 is less than the phase of the reference multi-phase clock signal CKD_270 (REF).

The timing diagram 500 is one example of a timing diagram for multi-phase clock signals that are in quadrature with each other. In other example, a similar timing diagram may be applied to multi-phase clock signals that differ in phase by more than or less than ninety degrees.

In one example, the output signals 530 and 532 are generated based on a comparison of the multi-phase clock signals CKD_0 and CKD_90 and CKD_180, and CKD_270. In such an example, the multi-phase clock signals CKD_0, CDK_90, CKD_180, and CKD_270 are the inputs to corresponding mixer circuitries (e.g., mixer circuitries 122 of FIG. 1), which generate the output signals 530 and 532 from the multi-phase clock signals CKD_0, CDK_90, CKD_180, and CKD_270.

In an example, where no phase errors are present within the multi-phase clock signals CKD_0, CKD_90, CKD_180, and CKD_270, the output signals 530a and 532a are generated. The output signals 530a and 532a have an average value of zero, indicating that no phase error is present within the corresponding multi-phase clock signals. Accordingly, the output signal $V_{OUTDIFF}$, which is generated based on the output signals 530a and 532a, has a voltage value of 0. With reference to FIG. 4, the output signal $V_{OUTDIFF}$ is the difference in voltage between the output signal 406a and 406b.

In an example, where a phase error is present within one or more of the multi-phase clock signals CKD_0, CKD_90, CKD_180, and CKD_270, the output signals 530b and 532b are generated. The output signals 530b and 532b have an average value that is non-zero, indicating that a phase error is present within the corresponding multi-phase clock signals. In one example, the average value is a negative value, and corresponds to a relative phase error within the multi-phase clock signals CKD_90 and CKD_270 with respect to CKD_0 and CKD_180. Accordingly, the output signal $V_{OUTDIFF}$, which is generated based on the output signals 530b and 532b, has a voltage value that is less than zero.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A phase detector circuitry comprising:
    first mixer circuitry configured to receive a first clock signal and a second clock signal, the first mixer circuitry comprising:
        a first plurality of transistors comprising:
            first transistors comprising a first input transistor and a second input transistor comprising gate nodes configured to receive the first clock signal;
            second transistors comprising a third input transistor and a fourth input transistor comprising gate nodes configured to receive the second clock signal; and
            a first output transistor configured to output a first output signal, wherein the first output signal corresponds to a first phase difference between the first clock signal and the second clock signal, wherein the third input transistor is coupled between the second input transistor and the first output transistor, and the first input transistor is coupled between the fourth input transistor and the first output transistor.

2. The phase detector circuitry of claim 1, wherein the first input transistor further comprises a drain node coupled to a source node of the first output transistor; and
    the second input transistor further comprises a source node configured to receive a first voltage signal, and a drain node.

3. The phase detector circuitry of claim 2, wherein the third input transistor further comprises a source node coupled to the drain node of the second input transistor, and a drain node coupled to the source node of the first output transistor; and
    the fourth input transistor further comprises a source node configured to receive the first voltage signal, and a drain node coupled to the source node of the first input transistor.

4. The phase detector circuitry of claim 3, wherein the first output transistor comprises a gate node configured to receive a first bias voltage signal, and drain node coupled to a first output node of the first mixer circuitry, where the first output transistor is configured to output the first output signal via the first output node based on the first bias voltage signal.

5. The phase detector circuitry of claim 1, wherein the first mixer circuitry further comprises a second plurality of transistors comprising:
    third transistors configured to receive the first clock signal;
    fourth transistors configured to receive the second clock signal; and
    a second output transistor configured to output a second output signal, wherein the second output signal corresponds to a second phase difference between the first clock signal and the second clock signal.

6. The phase detector circuitry of claim 5, wherein the third transistors comprise:
    a fifth input transistor comprising a gate node configured to receive the first clock signal, a drain node coupled to a source node of the second output transistor; and
    a sixth input transistor comprising a gate node configured to receive the first clock signal, a source node configured to receive a first voltage signal, and a drain node,
    and wherein the fourth transistors comprise:
    a seventh input transistor comprising a gate node configured to receive the second clock signal, a source node coupled to the drain node of the sixth input transistor, and a drain node coupled to the source node of second first output transistor; and
    an eighth input transistor comprising a gate node configured to receive the second clock signal, a source node configured to receive a second voltage signal, and a drain node coupled to the source node of the fifth input transistor.

7. The phase detector circuitry of claim 6, wherein the second output transistor comprises a gate node configured to receive a second bias voltage signal, and drain node coupled to a second output node of the first mixer circuitry, where the first output transistor is configured to output the second output signal via the second output node based on the second bias voltage signal.

8. The phase detector circuitry of claim 1 further comprising second mixer circuitry configured to receive a third clock signal and a fourth clock signal, third mixer circuitry configured to receive the third clock signal and the second clock signal, and a fourth mixer circuitry configured to receive the first clock signal and the fourth clock signal.

9. The phase detector circuitry of claim 1 further comprising a first capacitor coupled to the first output transistor and configured to receive the first output signal.

10. A multi-phase clock generation system comprising:
    clock generation circuitry configured to receive a reference clock signal and generate a plurality of clock signals;
    phase detection circuitry configured to receive the plurality of clock signals, the phase detection circuitry comprises:
        first mixer circuitry comprising:
            a first plurality of transistors configured to receive a first clock signal of the plurality of clock signals and a second clock signal of the plurality of clock signals and generate a first output signal based on a phase difference between the first clock signal and the second clock signal; and
            a first output transistor configured to output the first output signal; and
    amplifier circuitry configured to receive the first output signal and generate a first control signal based on the first output signal, and wherein the clock generation circuitry is configured to receive the first control signal and adjust the plurality of clock signals based on the first control signal.

11. The multi-phase clock generation system of claim 10, wherein the phase detection circuitry further comprises:

second mixer circuitry comprising:
a second plurality of transistors configured to receive a third clock signal of the plurality of clock signals and a fourth clock signal of the plurality of clock signals and generate a second output signal based on a phase difference between the third clock signal and the fourth clock signal; and
a second output transistor configured to output the second output signal.

12. The multi-phase clock generation system of claim 11, wherein the phase detection circuitry further comprises:
third mixer circuitry comprising:
a third plurality of transistors configured to receive the second clock signal and the third clock signal, and generate a third output signal based on a phase difference between the second clock signal and the third clock signal; and
a third output transistor configured to output the third output signal; and
fourth mixer circuitry comprising:
a fourth plurality of transistors configured to receive the second clock signal and the third clock signal, and generate a fourth output signal based on a phase difference between the second clock signal and the third clock signal; and
a fourth output transistor configured to output the fourth output signal.

13. The multi-phase clock generation system of claim 10, wherein the first output signal is a differential signal, and wherein the phase detection circuitry further comprises a first capacitor configured to receive a first signal of the first output signal, and a second capacitor configured to receive a second signal of the first output signal.

14. The multi-phase clock generation system of claim 10, wherein the first plurality of transistors comprises:
a first input transistor comprising a gate node configured to receive the first clock signal, and a drain node coupled to a source node of the first output transistor;
a second input transistor comprising a gate node configured to receive the first clock signal, a source node configured to receive a first voltage signal, and a drain node;
a third input transistor comprising a gate node configured to receive the second clock signal, a source node coupled to the drain node of the second input transistor, and a drain node coupled to the source node of the first output transistor; and
a fourth input transistor comprising a gate node configured to receive the second clock signal, a source node configured to receive the first voltage signal, and a drain node coupled to the source node of the first input transistor.

15. The multi-phase clock generation system of claim 10, wherein the first output transistor comprises a gate node configured to receive a first bias voltage signal, and drain node coupled to a first output node of the first mixer circuitry, where the first output transistor is configured to output the first output signal via the first output node based on the first bias voltage signal.

16. A non-transitory computer readable medium storing instructions that, when executed by a processor, cause the processor to generate a digital representation of an integrated circuit, comprising:
first mixer circuitry configured to receive a first clock signal and a second clock signal, the first mixer circuitry comprising:
a first plurality of transistors comprising:
first transistors comprising a first input transistor and a second input transistor comprising gate nodes configured to receive the first clock signal;
second transistors comprising a third input transistor and a fourth input transistor comprising gate nodes configured to receive the second clock signal; and
a first output transistor configured to output a first output signal, wherein the first output signal corresponds to a first phase difference between the first clock signal and the second clock signal, wherein the third input transistor is coupled between the second input transistor and the first output transistor, and the first input transistor is coupled between the fourth input transistor and the first output transistor.

17. The non-transitory computer readable medium of claim 16, wherein the first input transistor further comprises a drain node coupled to a source node of the first output transistor; and
the second input transistor further comprises a source node configured to receive a first voltage signal, and a drain node, and wherein the second transistors comprise:
the third input transistor further comprises a source node coupled to the drain node of the second input transistor, and a drain node coupled to the source node of the first output transistor; and
the fourth input transistor further comprises a source node configured to receive the first voltage signal, and a drain node coupled to the source node of the first input transistor.

18. The non-transitory computer readable medium of claim 17, wherein the first output transistor comprises a gate node configured to receive a first bias voltage signal, and drain node coupled to a first output node of the first mixer circuitry, where the first output transistor is configured to output the first output signal via the first output node based on the first bias voltage signal.

19. The non-transitory computer readable medium of claim 16, wherein the first mixer circuitry further comprises a second plurality of transistors comprising:
third transistors configured to receive the first clock signal;
fourth transistors configured to receive the second clock signal; and
a second output transistor configured to output a second output signal, wherein the second output signal corresponds to a second phase difference between the first clock signal and the second clock signal, and wherein the third transistors comprise:
a fifth input transistor comprising a gate node configured to receive the first clock signal, a drain node coupled to a source node of the second output transistor; and
a sixth input transistor comprising a gate node configured to receive the first clock signal, a source node configured to receive a first voltage signal, and a drain node, and wherein the fourth transistors comprise:
a seventh input transistor comprising a gate node configured to receive the second clock signal, a source node coupled to the drain node of the sixth input transistor, and a drain node coupled to the source node of second first output transistor; and
an eighth input transistor comprising a gate node configured to receive the second clock signal, a source node configured to receive a second voltage signal, and a drain node coupled to the source node of the fifth input transistor.

* * * * *